(12) United States Patent
Kato

(10) Patent No.: US 7,135,882 B2
(45) Date of Patent: Nov. 14, 2006

(54) SEMICONDUCTOR INTEGRATED CIRCUIT DEVICE AND CONTROL METHOD FOR THE SEMICONDUCTOR INTEGRATED CIRCUIT DEVICE

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/090,661

(22) Filed: Mar. 28, 2005

(65) Prior Publication Data
US 2005/0169060 A1    Aug. 4, 2005

Related U.S. Application Data

(63) Continuation of application No. PCT/JP03/04133, filed on Mar. 31, 2003.

(51) Int. Cl.
*G01R 31/26* (2006.01)

(52) U.S. Cl. ............... 324/765; 324/763; 324/73.1; 714/30

(58) Field of Classification Search ............ None
See application file for complete search history.

(56) References Cited

U.S. PATENT DOCUMENTS

| | | | |
|---|---|---|---|
| 5,894,226 A * | 4/1999 | Koyama ................ | 324/765 |
| 5,936,423 A | 8/1999 | Sakuma et al. | |
| 6,330,297 B1 | 12/2001 | Kano et al. | |
| 6,373,328 B1 * | 4/2002 | Rapp ..................... | 327/536 |
| 2003/0177415 A1 * | 9/2003 | Togashi et al. ........ | 714/30 |

FOREIGN PATENT DOCUMENTS

| | | |
|---|---|---|
| JP | 10-161898 | 6/1996 |
| JP | 09-061496 | 3/1997 |
| JP | 09-167828 | 6/1997 |
| JP | 11-101858 | 4/1999 |
| JP | 2000-193724 | 7/2000 |
| JP | 2000-315772 | 11/2000 |

* cited by examiner

*Primary Examiner*—Minh N. Tang
(74) *Attorney, Agent, or Firm*—Arent Fox PLLC (57) ABSTRACT

It is intended to provide a semiconductor integrated circuit device permitting reading of information specific to chips within the mounted chips while restraining the increase in the total number of terminals of the package and enabling the area of circuits required for reading information specific to chips to be made smaller than that according to the prior art, and a control method therefor. The same terminal is used as the external terminal to which the pulse signals are inputted and the external terminal from which the chip-specific information is outputted. Also, the external terminal for inputting/outputting required power supply in the normal operation mode and the external terminal for reading chip-specific information in the information reading mode are used in common. The increase in the number of external terminals can be thereby restrained. Moreover, the counter unit is shared between functional circuits and the comparative decision unit. This can serve to restrain the increase in chip area.

21 Claims, 10 Drawing Sheets

SEMICONDUCTOR INTEGRATED CIRCUIT DEVICE AND CONTROL METHOD FOR THE SEMICONDUCTOR INTEGRATED CIRCUIT DEVICE

CROSS-REFERENCE TO RELATED APPLICATIONS

This application is a continuation application based upon and claims the benefit of the prior PCT International Patent Application No. PCT/JP03/04133 filed on Mar. 31, 2003, the entire contents of which are incorporated herein by reference.

BACKGROUND OF THE INVENTION

1. Field of the Invention

The present invention relates to a semiconductor integrated circuit device and a control method therefor, and more particularly to a semiconductor integrated circuit device capable of reading information inherent to each chip at the time of testing or evaluation and a control method therefor.

2. Description of Related Art

Latest semiconductor devices store, within their nonvolatile devices, various items of product information specific to each chip (including the production plan, production lot number, wafer number and chip number) to ensure accurate tracking of faults in the market, and those items of information are made readable from outside in a packaged state.

As an example of the prior art, a technique disclosed in Japanese Unexamined Patent Publication No. 2000-315772 will be described with reference to FIG. 10. Pulse signals inputted to a clock pad Pc are counted by a binary counter 24 via a buffer circuit IBc, and binary data resulting from the counting of the pulse signals are supplied from this binary counter 24. A comparative decision circuit 22 compares binary data, which are the output of the binary counter 24, and data stored in a data holding unit 21 and, when the two sets of data are found identical, that decision result of identity is outputted to a pad P0 via a decision result output circuit 23. The outputting method is to output the result of decision by the comparative decision circuit 22 (identity) by causing a current to flow to the pad P0.

The binary counter 24 is configured by connecting in series a plurality of unit circuits (not shown). And there are provided as many unit circuits as corresponding to the number of bits of data specific to the chip stored in the data holding unit 21. For instance, where each of the items of information including the lot number, wafer number and chip number are to be stored as 10-bit specific data, the binary counter 24 is configured by connecting 10 unit circuits in series.

A pad in this context is an external terminal by which the semiconductor integrated circuit device and the outside are interfaced.

SUMMARY OF THE INVENTION

In a latest multi-chip package (hereinafter abbreviated to MCP) or a system in package (hereinafter abbreviated to SIP), while a plurality of chips are mounted on a single package, it is required to keep the number of external terminals of the package to the practicable minimum. However, according to the example of the prior art shown in FIG. 10, each chip requires a clock pad Pc and an output pad P0 as dedicated parts for information reading. Therefore, when two external terminals of the package are to be connected from the pads of each chip in the package, the total number of terminals of the package will increase, giving rise to a problem of inviting an expansion in package size and a rise in cost.

Figure 10:
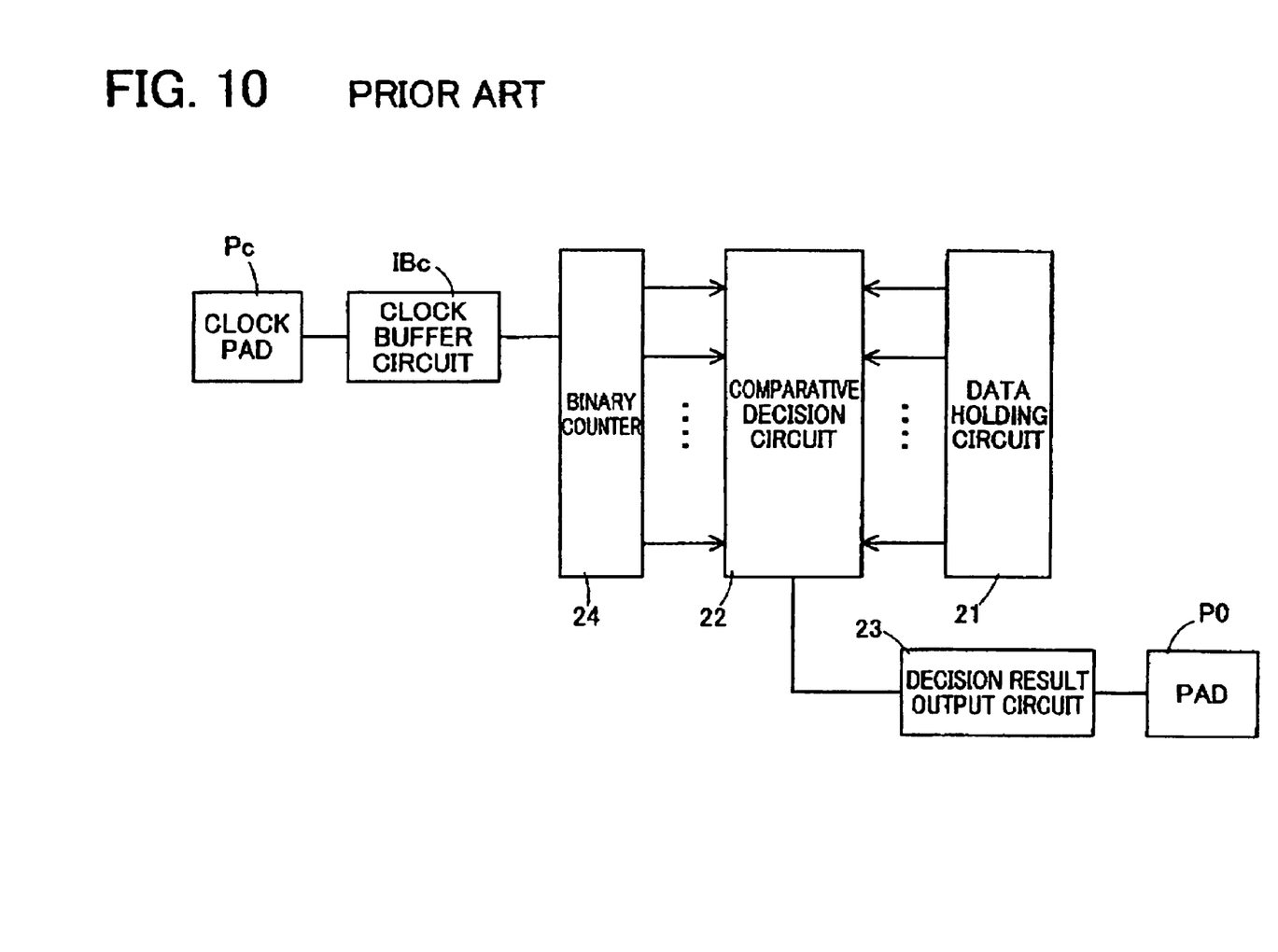
FIG. 10 is a block diagram showing the configuration of a semiconductor integrated circuit device according to the prior art.

Further, the binary counter 24 in FIG. 10 is configured by connecting in series as many unit circuits as corresponding to the number of bits of data stored in the data holding unit 21. Therefore, the number of bits of data increases with an increase in the amount of information of data specific to the chips, giving rise to a problem of inviting an expansion in the size of the binary counter and an increase in chip size.

An object of the present invention, attempted to resolve at least one of the above-stated problems of the prior art, is to provide a semiconductor integrated circuit device permitting reading of information specific to chips within the mounted chips in a packaged state while restraining the increase in the total number of terminals of the package and enabling the area of circuits required for reading information specific to chips to be made smaller than according to the prior art, and a control method therefor.

A semiconductor integrated circuit device according to the invention attempted to achieve the object stated above has an information reading mode for reading chip-specific information in addition to a normal operation mode. The normal operations in this context include, for instance, accessing at the time of reading information, accessing at the time of writing, and refreshing. The chip-specific information includes items of product information specific to a chip, stored within the chip by a data holding unit.

A counter unit or a counting step is to count pulse signals inputted from an external terminal. A data holding unit stores chip-specific information. A comparative decision unit or a comparative decision step is to compare the chip-specific information stored in the data holding unit and the output of the counter unit and to decide whether or not they are identical with each other. Any result of identity decision is outputted from the external terminal.

And the external terminal to which the pulse signals are inputted and the external terminal from which the chip-specific information is outputted are the same.

As the semiconductor integrated circuit device according to the invention is thereby enabled to read chip-specific information with a single external terminal unlike the prior art which requires two external terminals including one for inputting pulse signals and the other for outputting chip-specific information, it is made possible to reduce the number of external terminals.

A functional circuit is a circuit which requires at least either one of an input from the counter unit and an output to the counter unit, and may be, for instance, a circuit for controlling refreshing operations or a circuit for controlling burst operations.

In the normal operation mode of the semiconductor integrated circuit device, the counter unit is connected to functional circuits. In the information reading mode, the input of the counter unit is connected to the external terminal, and the output of the counter unit is connected to the comparative decision unit. Therefore, the counter unit is shared between at least one functional circuit and at least either one of the external terminal and the comparative decision unit.

As this enables the counter unit to be shared between a functional circuit and the comparative decision unit, there is no need to provide a dedicated counter unit for the reading of chip-specific information, and therefore the increase in chip area can be restrained.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Best modes for carrying out the invention each specifically embodied in a semiconductor integrated circuit device and a control method therefor will be described in detail below with reference to drawings including FIG. 1 through FIG. 9.

Figure 1:
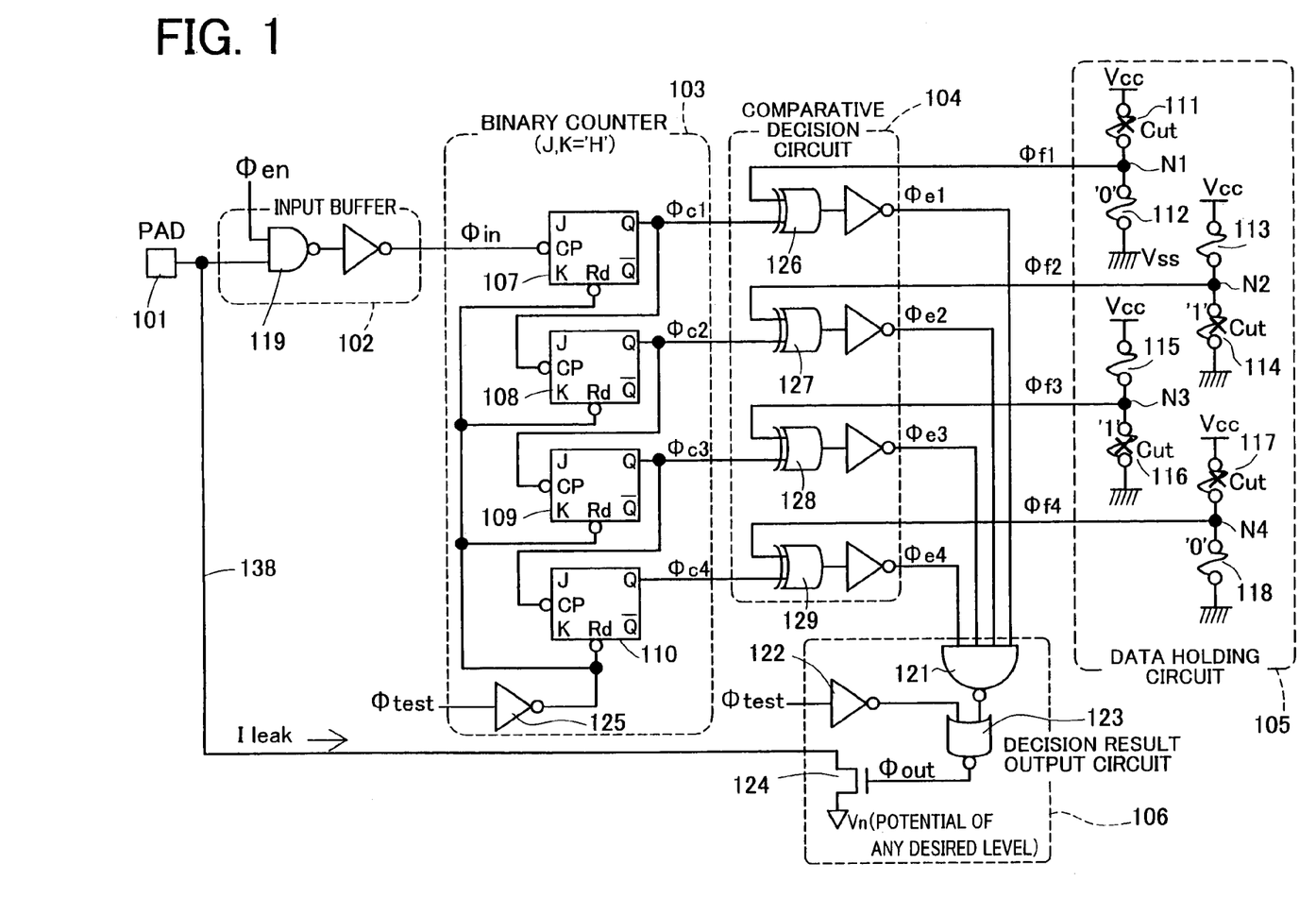
FIG. 1 is a circuit diagram showing the configuration of a semiconductor integrated circuit device in a first mode for implementing the invention.
Figure 2:
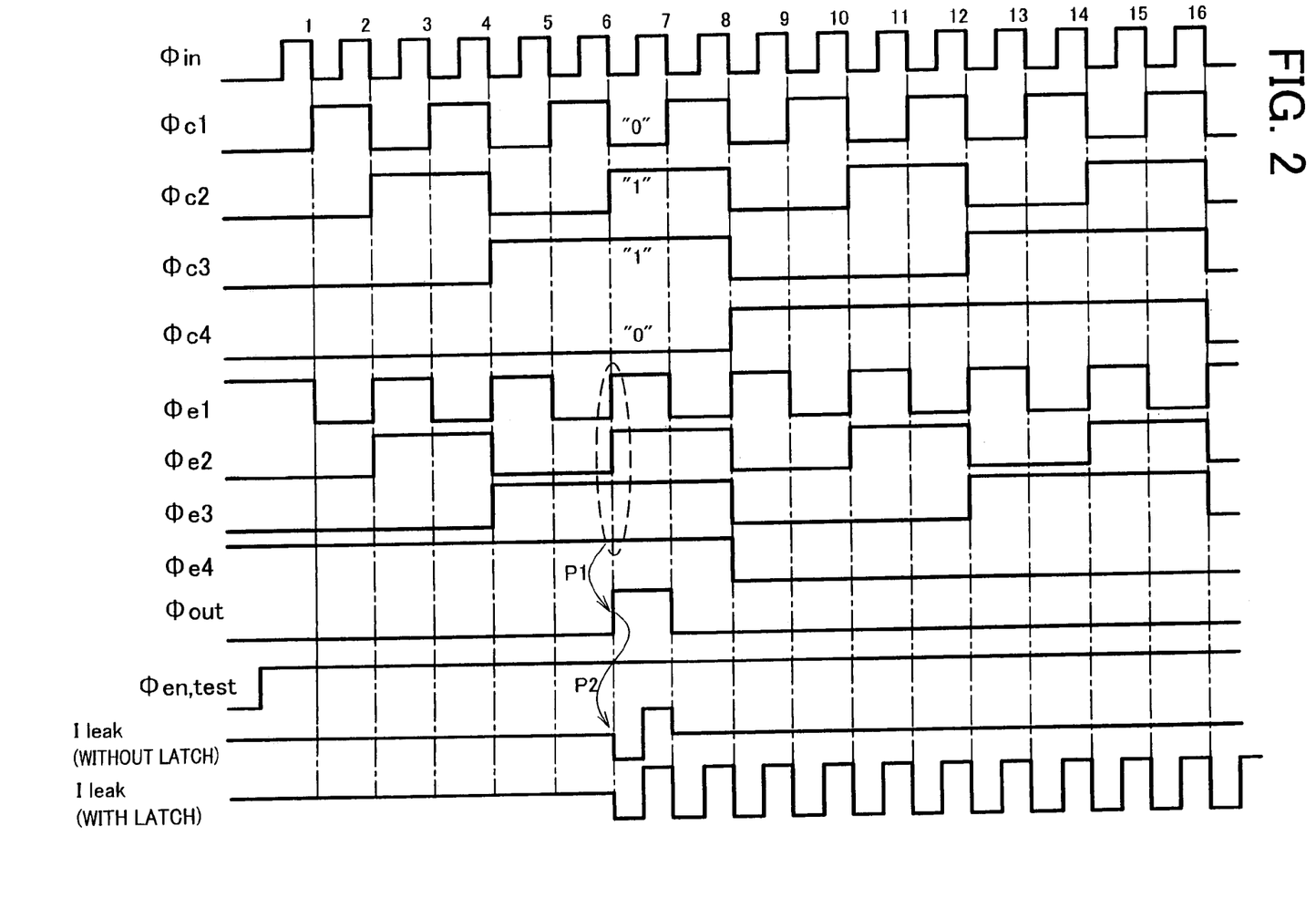
FIG. 2 shows a timing chart of the semiconductor integrated circuit device in the first mode for implementation.

The first mode for implementation will be described with reference to FIG. 1 and FIG. 2. FIG. 1 shows the configuration of a semiconductor integrated circuit device pertaining to the invention, and FIG. 2 is a timing chart. The circuit of FIG. 1 is configured of a pad 101, an input buffer 102, a binary counter 103, a comparative decision circuit 104, a data holding circuit 105 and a decision result output circuit 106. Data held by the data holding circuit 105 are supposed to be four-bit data. The decision result output circuit 106 here is one example of first decision result output unit.

An input clock signal from the pad 101 and a data read enable signal $\Phi$en are inputted to the NAND gate 119 of the input buffer 102, and the inverted output of the NAND gate 119 is inputted to the binary counter 103 as an input signal $\Phi$in. The binary counter 103 is configured of four JK flip-flops 107 through 110 connected in series, and the input signal $\Phi$in of the input buffer 102 is inputted to the clock input terminal CP of the flip-flop 107.

An information reading mode switching signal $\Phi$test is inputted to the inverter gate 125 of the binary counter 103, and the inverted output is inputted to the input enable signals Rd of the JK flip-flops 107 through 110. Signals $\Phi$c1 through $\Phi$c4 outputted from the binary counter 103 are inputted to the exclusive-OR gates 126 through 129 of the comparative decision circuit 104.

Nodes N1 through N4 in the data holding circuit 105 are connected to a source voltage Vcc and a ground voltage Vss via fuses 111 through 118. From the comparative decision circuit 104, the output signals $\Phi$c1 through $\Phi$c4 of the binary counter 103 and the output signals $\Phi$f1 through $\Phi$f4 of the data holding circuit 105 are inverted after undergoing exclusive-OR operation to be outputted as the output signals $\Phi$e1 through $\Phi$e4 of the decision comparative circuit. The output signals $\Phi$e1 through $\Phi$e4 of the decision comparative circuit are inputted to the NAND gate 121 of the decision result output circuit 106, and an information reading mode switching signal $\Phi$test is inputted to the inverter gate 122. Their outputs are inputted to a NOR gate 123, and an output control signal $\Phi$out, which is the output of the NOR gate 123 is inputted to the gate of an NMOS transistor 124. The drain terminal of the transistor 124 is connected to an information output path 138, and the source terminal of the same is connected to the supply line for an information output path voltage Vn.

The nodes N1 through N4 of the data holding circuit 105 are so structured that one of the fuses connected to the source voltage Vcc or the ground voltage Vss is cut off according to the data to be stored and information is thereby held.

Thus, in the node N1, as the fuse 111 connected to the source voltage Vcc is made non-conductive by the cut-off and the fuse 112 connected to the ground voltage Vss is made conductive, the output signal $\Phi$f1 of the data holding circuit 105 takes on a low level. Conversely in the node N2, as the fuse 113 connected to the source voltage Vcc is made conductive and the fuse 114 connected to the ground voltage Vss is made non-conductive by the cut-off, the output signal $\Phi$f2 of the data holding circuit 105 takes on a high level. Information is similarly held in the nodes N3 through N4, and output signals $\Phi$f3 through $\Phi$f4 are issued.

Operations will be described with reference to the timing chart of FIG. 2. When the information reading mode switching signal $\Phi$test takes on a high level, switching takes place from the normal operation mode to the information reading mode for reading chip-specific information. The normal operation mode in this context means the mode in which accessing at the time of reading information, accessing at the time of writing, and refreshing are performed.

When the information reading mode switching signal $\Phi$test of a high level is inputted to the inverter gate 125 of the binary counter 103, inverted output signals of a low level are inputted to the input enable signal terminals Rd of flip-flops 107 through 110, and the flip-flops reset to a low level all the output signals $\Phi$c1 through $\Phi$c4 of the binary counter 103 and enter into an input awaiting state.

Signals of a high level are inputted to the J and K terminals of the flip-flops 107 through 110 all the time, and each flip-flop performs toggle operation by which the high-level and low-level outputs alternate each other at every timing of the trailing edge of the input signal.

When a clock signal is inputted to the pad 101, an input signal $\Phi$in is outputted from the input buffer 102, and the binary counter 103 counts in synchronism with the timing of the trailing edge of the signal $\Phi$in.

The output signal $\Phi$c1 of the binary counter 103 and the output signal $\Phi$f1 of the data holding circuit 105 are inputted to the exclusive-OR gate 126 of the comparative decision circuit 104; only when the two inputs are identical, a signal of a low level is outputted from the exclusive-OR gate 126, and a signal resulting from its inversion is inputted to the NAND gate 121 of the decision result output circuit 106 as the output signal Φe1 of the decision comparative circuit. Similar processing is hereinafter applied to the output signals Φe2 through Φe4 of the decision comparative circuit.

When the combination of high and low levels of the output signals Φc1 through Φc4 of the binary counter 103 and the combination of high and low levels of the output signals Φf1 through Φf4 of the data holding circuit 105 are wholly identical with each other, every one of the output signals Φe1 through Φe4 of the decision comparative circuit inputted to the NAND gate 121 of the decision result output circuit 106 takes on a high level, and as a result the output of the NAND gate 121 takes on a low level. On the other hand, the output of the inverter gate 122 is at a low level as long as the information reading mode switching signal Φtest is at a high level. Therefore, when the values of the binary data of the binary counter 103 and of the data holding circuit 105 are identical, the output control signal Φout, which is the output of the NOR gate 123, takes on a high level, and the NMOS transistor 124 becomes conductive. Therefore, the information output path 138 from the pad 101 to the information output path voltage Vn is established, and a current leak Ileak occurs in the pad 101.

As an example, a case will be described below in which "0 (low level), 1 (high level), 1, 0" are respectively held by the nodes N1 through N4 of the data holding circuit 105, inputting of clock signals to the pad 101 take place between the source voltage Vcc and the ground voltage Vss, ½ Vcc is used as the information output path voltage Vn, and Vcc is used as the voltage when the output control signal Φout is at a high level.

In FIG. 2, the binary counter output signals Φc1 through Φc4 take on a combination of "0, 1, 1, 0" at the timing of the sixth-cycle trailing edge of the input signal Φin, and this combination is identical with that of the output signals Φf1 through Φf4 of the data holding circuit. At this point of time, all the output signals Φe1 through Φe4 of the comparative decision circuit take on a high level, and the output control signal Φout also takes on a high level (the source voltage Vcc) (arrow P1 in the chart). Therefore, the transistor 124 becomes conductive, and a leak current Ileak flows to the pad 101 via the information output path 138 (arrow P2 in the chart).

Then, since the voltage of the pad 101 is the source voltage Vcc and the information output path voltage Vn is ½ Vcc during the high-level period of the input signal Φin as shown in FIG. 2, the leak current flows in the positive direction of the leak current Ileak (the direction from the pad 101 toward the source of the information output path voltage Vn). Conversely, during the low-level period of the input signal Φin, since the voltage of the pad 101 is the ground voltage Vss and the information output path voltage Vn is ½ Vcc, the leak current flows in the negative direction of the leak current Ileak.

In order to output the decision result at the timing of the trailing edge of the input signal Φin, the low-level voltage of the input signal Φin to the pad 101 being represented by Vin (min), it is necessary to use different values for Vin (min) and for the information output path voltage Vn. This is to secure a source-drain voltage VDS for the transistor 124. The high-level voltage of the output control signal Φout is made higher than the low-level voltage Vin (min) of the input signal or the information output path voltage Vn, whichever is lower, by the threshold voltage Vth of the transistor 124 or by a greater difference. This is to enable the transistor 124 to perform on/off operations.

To add, when the level of the information output path voltage Vn is made different from the level of the input signal Φin, the leak current Ileak can be outputted in at least either of the high- and low-level periods of the input signal Φin.

As hitherto described, in the first mode for implementation, when a clock signal is inputted to the pad 101, a current leak arises in the pad 101, and it is thereby enabled to check the result of decision from outside. While the prior art requires two pads, including one for the inputting of clock signals and the other for outputting data, this first mode for implementation requires no more than one pad, and therefore external terminals of the package to be connected to the pad for data outputting can be dispensed with. This proves particularly effectively for an MCP or an SIP which is to mount a plurality of chips per package.

To add, it is also conceivable to make the transistor 124 conductive only during the clock cycle of the input signal Φin when the output control signal Φout takes on a high level as shown in FIG. 2 so as to enable the leak current Ileak (without latch) to flow. Or it is also possible to latch the output signal of the NOR gate 123 with a latch not shown, so that once the signal Φout takes on a high level, the transistor 124 remain conductive all the time and enable the leak current Ileak (with latch) to flow. To add, the pad 101 is not limited to a pad for signal input/output use.

Figure 3:
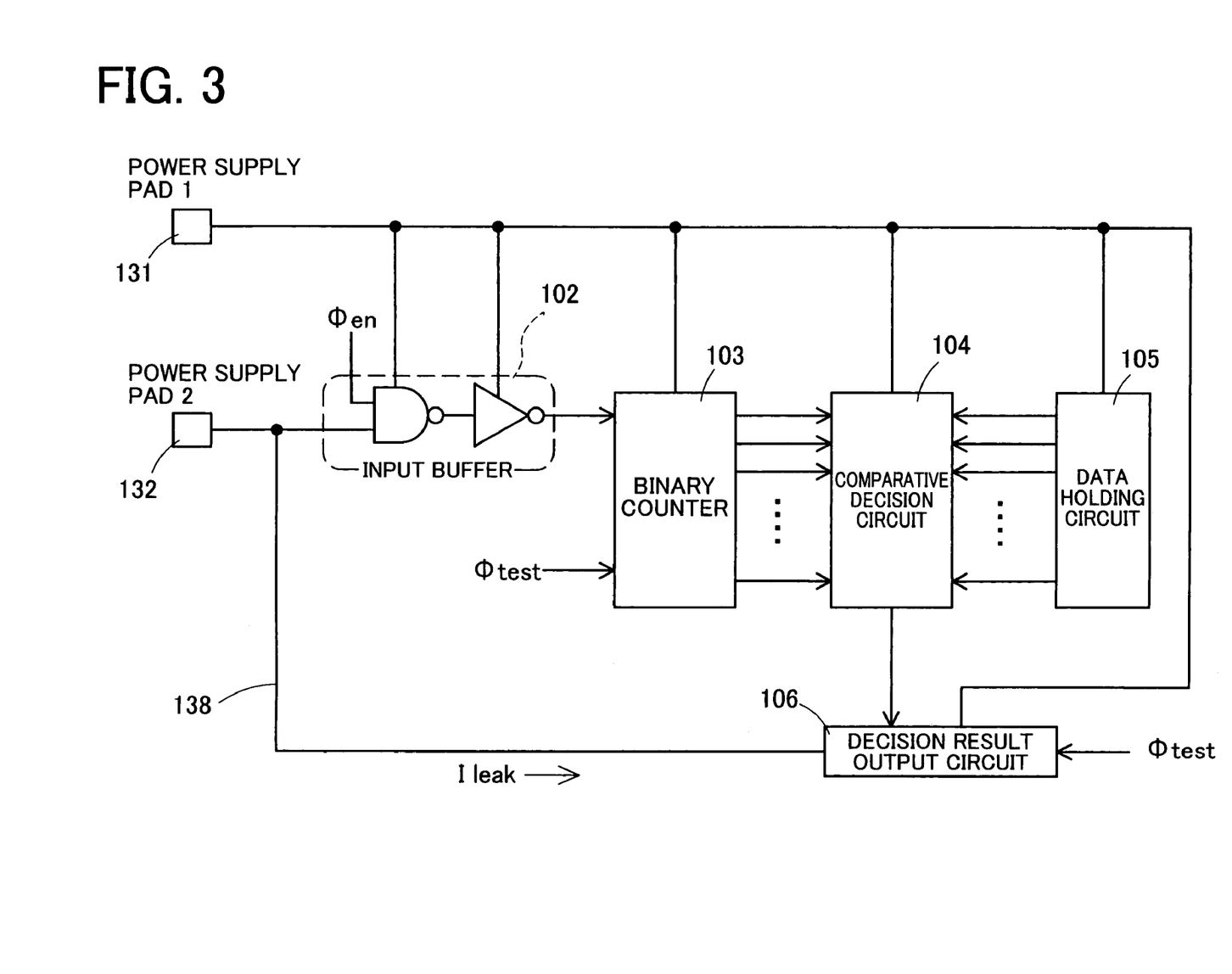
FIG. 3 is a block diagram showing the configuration of a semiconductor integrated circuit device in a second mode for implementation.

A second mode for implementation will be described with reference to FIG. 3. In FIG. 3, an input buffer 102, a binary counter 103, a comparative decision circuit 104, a data holding circuit 105 and a decision result output circuit 106 have respectively the same circuit configurations as in the first mode for implementation. Differences from the first mode for implementation include, firstly, a power supply pad is used as the pad for signal input/output use. A second point is that the power supply pad for supplying power to the circuits 102 through 106 differs from the pad for signal input/output use.

In the second mode for implementation, a power supply pad 2 (132) is used for signal inputting and outputting, and circuits received power supply from another power line from a power supply pad 1 (131).

In FIG. 3, when a clock signal is inputted to the power supply pad 2, when data held by the data holding circuit 105 and data of the binary counter 103 are identical, a leak current Ileak flows on the information output path 138 as in the first mode for implementation. It is thereby enabled to check the result of decision from outside.

In the second mode for implementation, power supplied from the power supply pad 2 (132), which is used for inputting and outputting clock signals, is not used for supply to the circuits 102 through 106. Instead, another power line from the power supply pad 1 (131) is used. This is because the circuits 102 through 106 no longer operate stably when a clock signal is inputted to the power supply pad 1 (131).

For instance, it is advisable to use a peripheral circuit power source as the power supply pad 1 (131) and a power source for circuits not needed for reading chip-specific information regarding the information reading mode as the power supply pad 2 (132). Examples of power source to be used as the power supply pad 2 (132) include a power source for I/O use and a dedicated power source for a delay locked loop (DLL) circuit or a phased locked loop (PLL) circuit.

Since the power supply pad 1 (131) has no signal input or output from or to any external terminal in the information reading mode, it is not absolutely necessary to connect it to any external terminal of the package. Therefore it may be connected to some other power supply line or the like in the package to receiver power supply.

Where a plurality of chips are mounted within a single package as in an SIP or an MCP, there is a chip or chips in which only one power supply pad is connected to the external terminal of the package. Usually such a situation arises where it is desired to reduce the number of external terminals in an SIP or the like.

Even in such a case, when at least a power supply pad such as the power supply pad 2 is connected to an external terminal of the package, a single power supply pad can provide for two kinds of operations including power supply in the normal operation mode and the reading of chip-specific information in the information reading mode. Accordingly, since there is no need for a dedicated external terminal for reading chip-specific information, chip-specific data can be read out regarding every chip to be mounted on the package without increasing the total number of terminals of the package.

Figure 4:
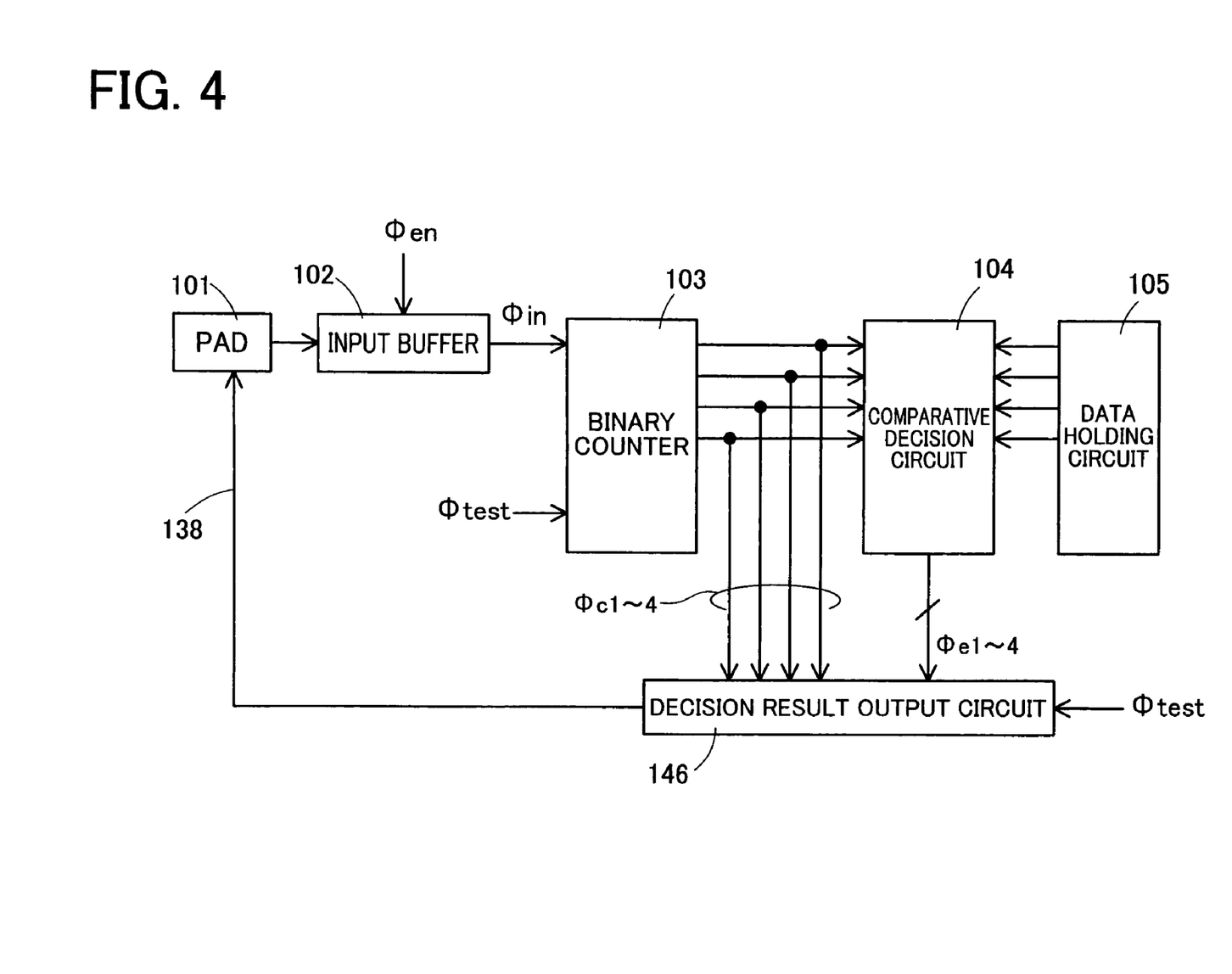
FIG. 4 is a block diagram showing the configuration of a semiconductor integrated circuit device in a third mode for implementation.

A third mode for implementation will be described with reference to FIG. 4 through FIG. 6. In the third mode for implementation, there is provided an input/output switching unit for switching from a signal input period during which pulse signals are inputted from an external terminal to a counter unit to a signal output period during which chip-specific information is outputted to an external terminal. And a clock signal having a number of clocks corresponding to the chip-specific information is outputted to the external terminal.

The third mode for implementation is characterized by its decision result output circuit 146. Its pad 101, input buffer 102, binary counter 103, comparative decision circuit 104 and data holding circuit 105 have respectively the same circuit configurations as in the first mode for implementation. The decision result output circuit 146 here is an example of second decision result output unit. Details of the decision result output circuit 146 in the third mode for implementation are shown in FIG. 5, and a timing chart is shown in FIG. 6.

Figure 5:
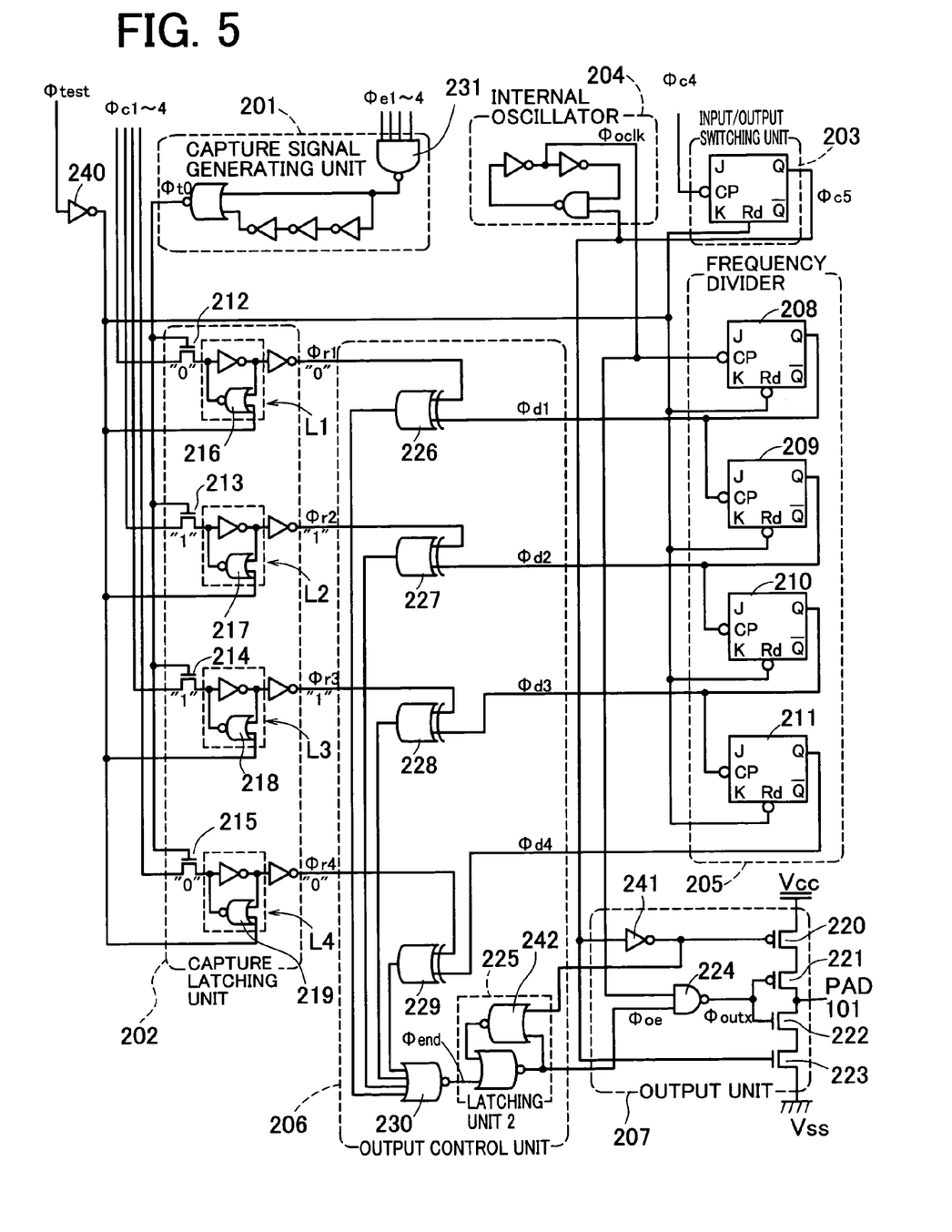
FIG. 5 is a circuit diagram showing the configuration of the semiconductor integrated circuit device in the third mode for implementation.

The circuit of FIG. 5 is configured of a capture signal generating unit 201, a capture latching unit 202, an input/output switching unit 203, an internal oscillator 204, a frequency divider 205, an output control unit 206 and an output unit 207. To this circuit, the information reading mode switching signal Φtest, binary counter output signals Φc1 through Φc4, and decision comparative circuit output signals Φe1 through Φe4 are entered. The frequency divider here is an example of counter unit for counting clock signals from an internal oscillator.

When an information reading mode switching signal Φtest of a high level is inputted, low-level signals inverted by the inverter gate 240 are inputted to the input enable signal terminals Rd of JK flip-flops 208 through 211 of the frequency divider 205 and NOR gates 216 through 219 of the capture latching unit 202. As a result, the output signals Φd1 through Φd4 of all the flip-flops of the frequency divider 205 are reset to a low level. Further, the NOR gates 216 through 219 of the capture latching unit 202 become equivalent to the inverter gate, and latching circuits L1 through L4 are activated. And the frequency divider 205 and the capture latching unit 202 enter into an input awaiting state.

A case in which data "0, 1, 1, 0" are held by the data holding circuit 105 will be described with reference to FIG. 6. When the data of the binary counter 103 and of the data holding circuit 105 become identical at the timing of the trailing edge signal of the eighth cycle of the input signal Φin, the decision comparative circuit output signals Φe1 through Φe4, all in a high level, are entered into a NAND gate 231 (area A1 in the chart), and the capture signal generating unit 201 outputs a trigger signal Φt0 of a high-level pulse (arrow S1 in the chart).

Transistors 212 through 215 of the capture latching unit 202 are made conductive by the signal Φt0, and the respective values "0, 1, 1, 0" of the output signals Φe1 through Φe4 of the binary counter, having proved identical with the data holding circuit 105, are latched by the latching circuits L1 through L4.

The latched data are inverted via the inverter gate, and "0, 1, 1, 0" as the respective values of the capture latching unit output signals Φr1 through Φr4 are inputted to exclusive-OR gates 226 through 229 of the output control unit 206.

When the trailing edge signal of the 16th cycle from the input signal Φin is issued, the signal input period ends and a shift to the signal output period takes place. The trailing edge signal of the signal Φc4, which is the most significant bit of the output signal of the binary counter 103 is inputted to the input/output switching unit 203 (arrow S2 in the chart).

The input/output switching unit 203 is configured of JK flip-flops, and signals of a high level are always inputted to the J and K terminals to cause toggle operations to be performed. The initial outputs of the JK flip-flops when the information reading mode is entered into are at a low level. And when the trailing edge signal of the signal Φc4 is inputted to the input/output switching unit 203, an input/output switching unit output signal Φc5 of a high level is outputted from the input/output switching unit 203 (arrow S2 in the chart) as a sign of the shift from the signal input period to the signal output period.

When the input/output switching unit output signal Φc5 of a high level is inputted, the internal oscillator 204 begins outputting clock signals Φoclk of a high level (arrow S3 in the chart). Further, when the high-level signal Φc5 is inputted to the output unit 207, transistors 220 and 223 are made conductive and enabled to provide outputs. During the period of their being enabled to provide outputs, a low-level signal of the ground voltage Vss is outputted when the output signal Φoutx of a NAND gate 224 is at a high level, or a high-level signal of the source voltage Vcc is outputted when the signal Φoutx is at a low level, to the pad 101.

The clock signal Φoclk is inputted to the NAND gate 224 of the output unit 207. To the other input of the NAND gate 224, an output enable signal Φoe, which is the output of a latching unit 2 (225) provided at the output stage of the output control unit 206, is inputted. The output enable signal Φoe is a signal for controlling the output of the output unit 207. As long as the output enable signal Φoe is at a high level, signals synchronized with the clock signal Φoclk are outputted to the pad 101. Conversely, as long as the output enable signal Φoe is at a low level, low-level signals are always outputted to the pad 101. Thus, when the output enable signal Φoe is at a high level and the clock signal Φoclk is at a high level, transistors 221 and 222 are respectively made conductive and non-conductive, and the source voltage Vcc is supplied to the pad 101; conversely, while the clock signal Φoclk is at a low level, the transistors 221 and 222 are respectively made non-conductive and conductive, and the ground voltage Vss is supplied to the pad 101. This causes output signals synchronized with the clock signal Φoclk to be outputted to the pad 101 according to the period during which the output enable signal Φoe is at a high level.

The frequency divider 205 is configured of JK flip-flops 208 through 211, and operates as a binary counter. The clock signal Φoclk is inputted to the clock input terminal CP of the first-stage JK flip-flop 208, and the output of each JK flip-flop is inputted to the clock input terminal CP of the flip-flop of the next stage. Signals of a high level are always inputted to the J and K terminals of the JK flip-flops to cause toggle operations to be performed.

The frequency divider 205 is caused to operate as a binary counter by the trailing edge signal of the clock signal Φoclk, and outputs frequency divider output signals Φd1 through Φd4, which are four-bit counts, to the output control unit 206.

The capture latching unit output signals Φr1 through Φr4 and the frequency divider output signals Φd1 through Φd4 are respectively inputted to exclusive-OR gate 226 through 229 of the output control unit 206. The outputs of the exclusive-OR gate 226 through 229 are inputted to a NOR gate 230. The output of the NOR gate 230 is inputted to the latching unit 2 (225) as an output end signal Φend, and the output from the latching unit 2 (225) is inputted to the NAND gate 224 of the output unit 207 as an output enable signal Φoe.

When the information reading mode switching signal Φtest is set to a high level and the operating mode is switched from the normal operation mode to the information reading mode, the output signal Φc5 of the input/output switching unit 203 is reset to a low level. And the signal Φc5 is inverted to a high level by an inverter gate 241, and inputted to a NOR gate 242 of the latching unit 2 (225). As a result, the output enable signal Φoe, which is the output of the latching unit 2 (225), is maintained at a high level from the beginning of its transition from the normal operation mode to the information reading mode. And after the transition of the output enable signal Φoe to the high level, the output signal Φc5 of the input/output switching unit 203 takes on a high level and, as the signal output period comes, the output unit 207 enters into a period in which data outputting is possible.

And when the capture latching unit output signals Φr1 through Φr4 and the four-bit data of the frequency divider output signals Φd1 through Φd4 of the frequency divider 205 are identical, all the outputs of the exclusive-OR gates 226 through 229 take on a low level, and an output end signal tend is outputted from the NOR gate 230. When the high-level output end signal Φend is inputted to the latching unit 2 (225), the output enable signal Φoe, which is its output, shifts to a low level (arrow S4 in the chart).

When the low-level output enable signal Φoe is inputted to the NAND gate 224 of the output unit 207, the output of the NAND gate 224 maintains a high level all the time irrespective of the inputting of the other clock signal Φoclk, and as a result signal outputting of chip-specific information is ended by the maintained connection of the pad 101 to the ground voltage Vss. Thus, as long as the output enable signal Φoe is at a low level, the output unit 207 enters into a data output-suspended state.

As an example, a case in which data of "0, 1, 1, 0" are latched by the capture latching unit 202 will be described.

Figure 6:
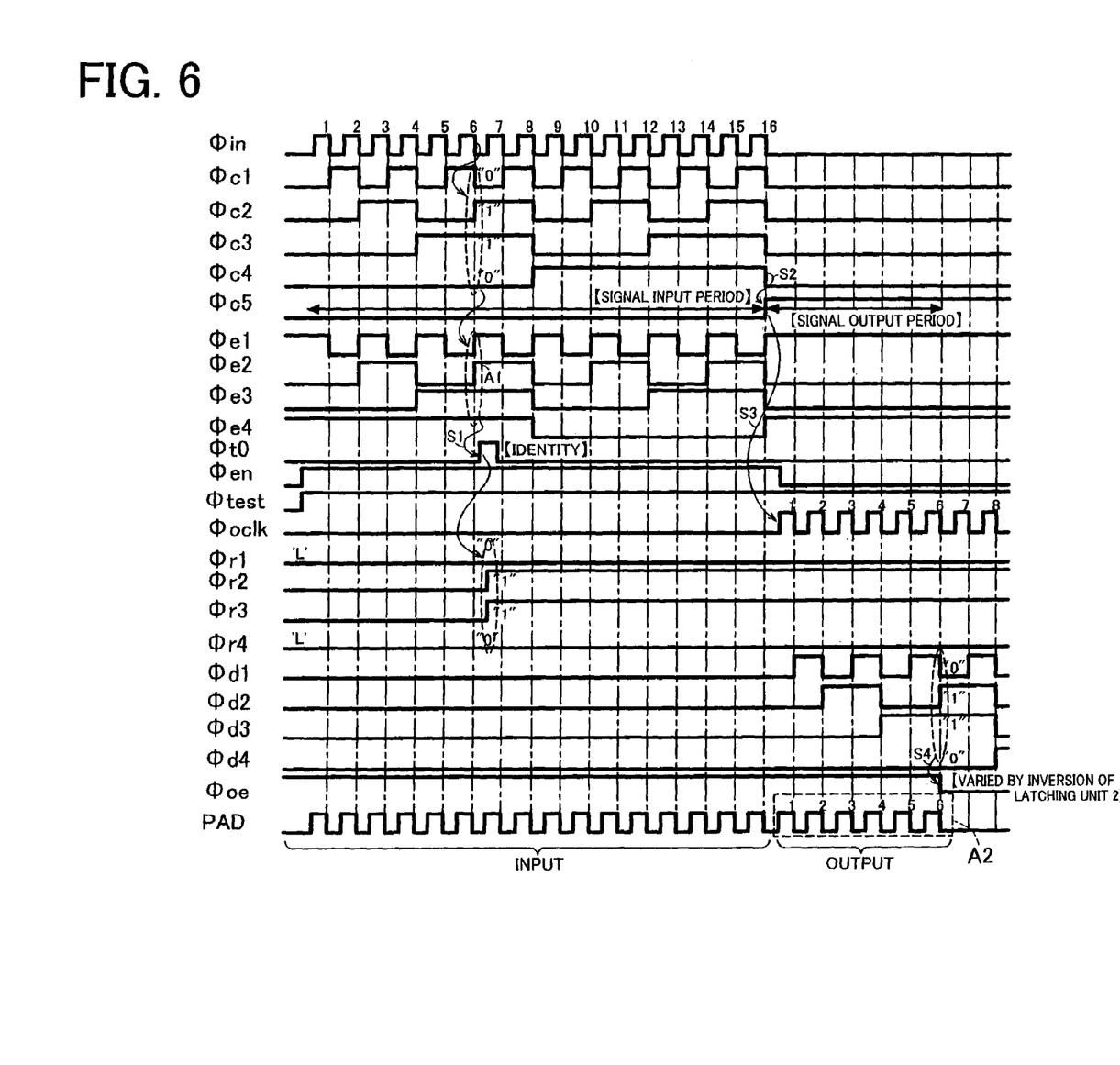
FIG. 6 shows a timing chart of the semiconductor integrated circuit device in the third mode for implementation.

In FIG. 6, the signal output period arrives at the timing of the trailing edge signal of the signal Φe4, which is a superior bit of the binary counter output signal (arrow S2 in the chart). And the signal output period stays on until the output enable signal Φoe shifts to a low level, and a clock signal synchronized with the clock signal Φoclk is outputted to the pad 101. Thus, since the binary data are "0, 1, 1, 0", "six" pulses as decimally converted are outputted to the pad 101 in synchronism with the clock signal Φoclk (A2 in the chart). And when "six" pulses are outputted, as the data of the latched binary sequence and the data of the binary sequence of the binary counter of the frequency divider 205 become "0, 1, 1, 0" and accordingly identical with each other, the output enable signal Φoe takes on a low level (arrow S4 in the chart), and the pad 101 is connected to the ground voltage Vss all the time to end the signal output period.

As hitherto described, the third mode for implementation is a mode in which the input/output data of one pad are controlled with differentiation between a signal input period and a signal output period. Chip-specific data made definite according to clock signals inputted during the signal input period are stored in the capture latching unit 202, and a clock number of clock signals corresponding to the stored data are outputted during the signal output period.

Thus, when clock signals corresponding to the number of bits of the chip-specific information are inputted to the pad 101, the chip-specific information latched by the latching unit 202 is outputted to the pad 101 as pulse signals after the end of the signal input period of the clock signal. Then, the chip-specific information stored as a binary sequence is outputted to the pad 101 as the clock number of clock signals.

As in this way, first, the signal input period and the signal output period are differentiated in control, there is no conflict between input signals and output signals, resulting in an advantage that the reading of chip-specific information is made more certain. Second, there is an advantage of low current consumption because the output is voltage instead of current.

Further, the third mode for implementation can be similarly applied where the pad 101 is a power supply pad as in the second mode for implementation.

A fourth mode for implementation will be described with reference to FIG. 7 and FIG. 8.

In the fourth mode for implementation, as in the third mode for implementation, there is provided an input/output switching unit for switching from the signal input period to the signal output period. And during the signal output period, a count, which is chip-specific information, is outputted to an external terminal. At the times of starting and ending an output, a start flag signal and an end flag signal are issued, respectively.

The fourth mode for implementation is a mode for implementation with a change in the third mode for implementation only in respect of the decision result output circuit 146. Details of the decision result output circuit 146 characterizing the fourth mode for implementation are shown in FIG. 7, and its timing chart is shown in FIG. 8.

Figure 7:
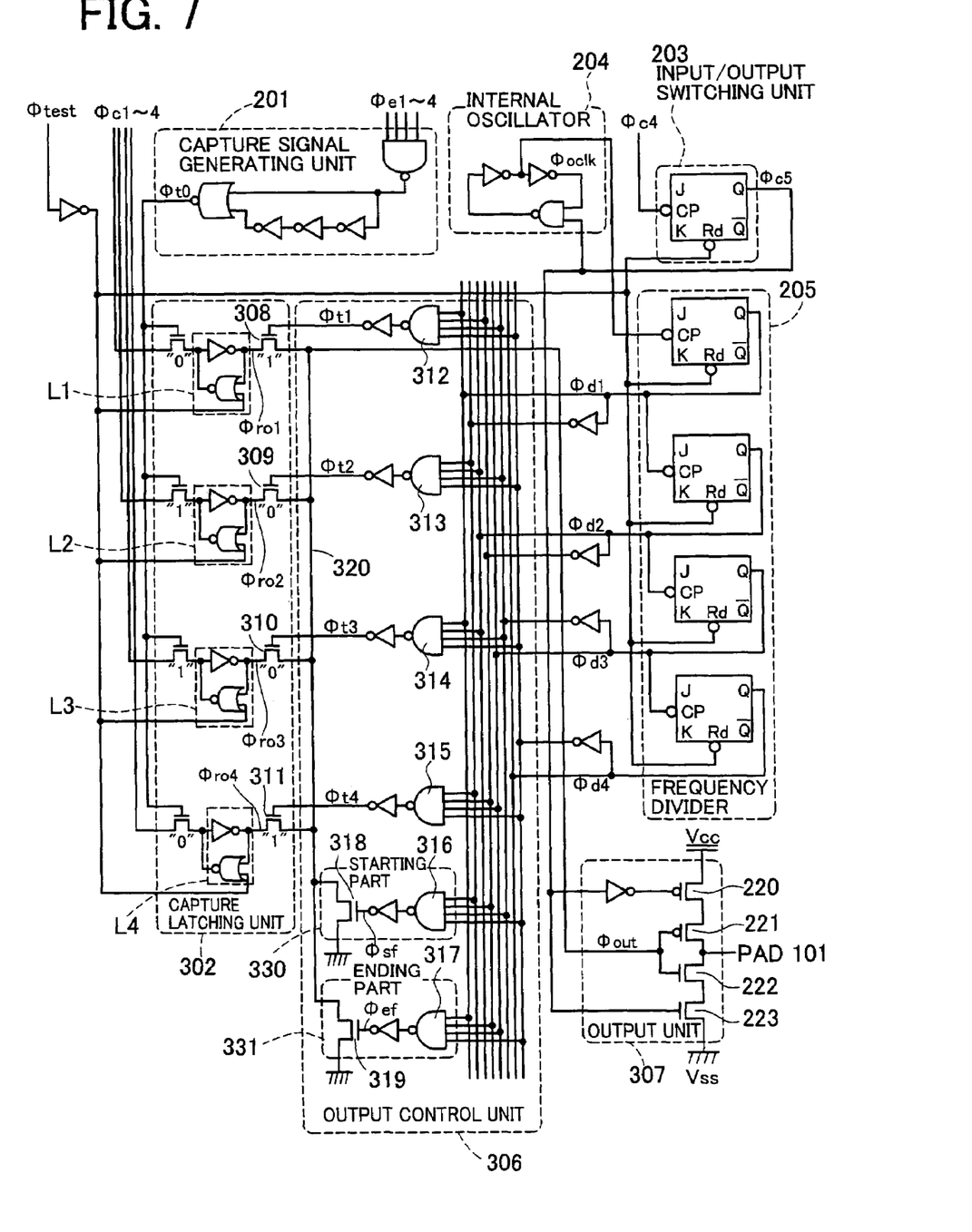
FIG. 7 is a circuit diagram showing the configuration of a semiconductor integrated circuit device in a fourth mode for implementation.

The circuit of FIG. 7 is configured of a capture signal generating unit 201, a capture latching unit 302, an input/output switching unit 203, an internal oscillator 204, a frequency divider 205, an output control unit 306 and an output unit 307. Of these, the configurations of three circuits including the capture latching unit 302, the output control unit 306 and the output unit 307 characterize the fourth mode for implementation, and the configurations and operations of other circuit are the same as in the third mode for implementation.

In the fourth mode for implementation, the output control unit 306 is a circuit performing decoder operations. Normal phase and reversed-phase complementary signals are created for each of the output signals Φd1 through Φd4 of the frequency divider 205, and inputted to NAND gates 312 through 317 of the output control unit 306.

Output control unit output signals Φt1 through Φt4 outputted from the NAND gates 312 through 315 in an inverted form are inputted to transistors 308 through 311 of the capture latching unit 302. In latching circuits L1 through L4 of the capture latching unit 302, the output signals Φc1 through Φc4 of the binary counter are latched in an inverted form, and capture latching unit output signals Φro1 through Φro4, which are their output signals, and outputted to the output unit 307 via a signal line 320.

Further, a start flag signal Φsf and an end flag signal Φef outputted from NAND gates 316 and 317 in an inverted form are respectively inputted to NMOS transistors 318 and 319 of the output control unit 306. The drain terminals of the transistors 318 and 319 are connected to the signal line 320, and their source terminals are grounded to constitute the ground voltage Vss.

The outputs of the starting part and the ending part of the capture latching unit 302 and the output control unit 306 are all outputted to the output unit 307 via the signal line 320 as output control signals Φout.

An output control signal rout and an input/output switching unit output signal Φc5 are inputted to the output unit 307. When the signal Φc5 of a high level is inputted, the transistors 220 and 223 of the output unit 307 are made conductive and placed in a state in which outputting is possible. During the period of the state in which outputting is possible, a low-level signal of the ground voltage Vss is outputted to the pad 101 when the output control signal Φout is at a high level, or a high-level signal of the source voltage Vcc is when the signal Φout is at a low level.

Figure 8:
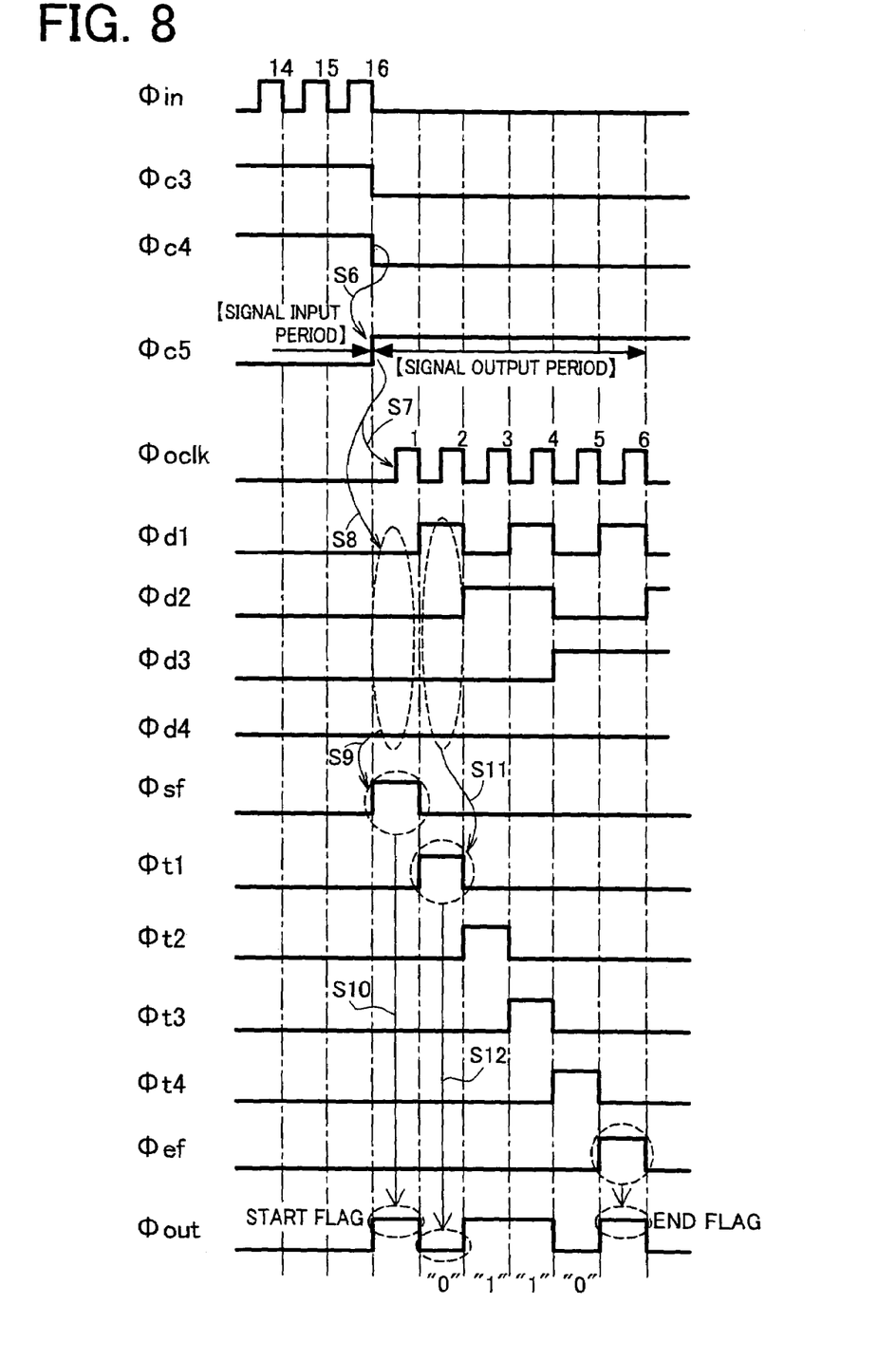
FIG. 8 shows a timing chart of the semiconductor integrated circuit device in the fourth mode for implementation.

In FIG. 8, when the trailing edge signal of the 16th cycle of the input signal Φin is issued, the signal input period ends, and a shift to the signal output period takes place. As operations during the signal input period are the same as in the third mode for implementation, their description is dispensed with here.

The input/output switching unit output signal Φc5 is inverted to a high level to match with the trailing edge signal of the output signal Φc4 of the binary counter 103, and the signal output period begins (arrow S6 in the chart). At the same time, clock signals Φoclk begin to be generated (arrow S7 in the chart).

The output control unit 306 successively makes conductive the transistor 318 of the starting part 330, the transistors 308 through 311 of the capture latching unit 302 and the transistor 319 of the ending part 331, and performs operations to take out signals.

At the stage of having shifted to the signal output period, the output signals Φd1 through Φd4 from the frequency divider 205, standing at "0, 0, 0, 0", are all at a low level (arrow S8 in the chart), and all the inputs to the NAND gate 316 of the starting part are at a high level. And the inverted output of the NAND gate 316 is inputted to the gate of the transistor 318 as a start flag signal Φsf of a high level (arrow S9 in the chart). The transistor 318 to which the signal Φsf of a high level is made conductive, and a low-level signal of the ground voltage Vss is inputted to the output unit 307 via the signal line 320. When the low-level output control signal Φout is inputted to the output unit 307, the transistor 221 is made conductive and the transistor 222 non-conductive, and a high-level signal of the source voltage Vcc is outputted to the pad 101 (arrow S10 in the chart).

As described above, the start flag signal Φsf is a signal used for causing a high-level output equivalent to one clock to the pad 101 as the start flag signal to indicate to the pad the start of outputting.

At the timing of the trailing edge signal of the first cycle of the next clock signal Φoclk, the output signals Φd1 through Φd4 from the frequency divider 205 take on a combination of "1, 0, 0, 0"; then all the inputs to the NAND gate 312 are at a high level, and an inverted high-level output is inputted to the gate of the transistor 308 as the output control unit output signal Φt1 (arrow S11 in the chart). The binary counter output signal Φc1 of a low level is latched by the latching circuit L1 of the capture latching unit 302, and a high-level signal capture latching unit output signal Φro1 resulting from the inversion of the signal Φc1 is outputted to the output unit 307 via the signal line 320. As a result, a low-level signal of the ground voltage Vss is outputted to the pad 101 (arrow S12 in the chart).

Similarly thereafter, signals latched in the sequence of output control unit output signals Φt2, Φt3 and Φt4 are outputted as latching unit output signals Φro2, Φro3 and Φro4 at the timings of the trailing edge signals of the second, third and fourth cycles of the clock signal Φoclk.

Finally, the end flag signal Φef, which is the inverted output of the NAND gate 317 of the ending part, takes on a high level at the trailing edge signal of the fifth cycle of the clock signal Φoclk, and the transistor 319 is made conductive. And the low-level end flag signal Φef of the ground voltage Vss is inputted to the output unit 307 via the signal line 320, and a high-level signal of the source voltage Vcc is outputted to the pad 101. In this way, the end flag signal Φef is a signal used for causing a high-level output equivalent to one clock to the pad 101 as the end flag signal to indicate to the pad the end of outputting.

As hitherto described, in the fourth mode for implementing the invention, as in the third mode for implementation, when a clock signal is inputted to the pad 101, chip-specific information is outputted to the pad 101 as a pulse signal, and it is characteristic in that the chip-specific information is then outputted to the pad 101 as a binary sequence. Even where the number of bits of the data handled increases and outputting clock signals in a clock number corresponding to the stored data would take a long time, outputting in a binary sequence makes possible rapid and accurate reading of data and moreover is easy to be handled. Further in outputting chip-specific information to the pad 101, as a start flag indicating the start of the signal output period and an end flag indicating its end are issued, the certainty of data reading is ensured.

Also, the fourth mode for implementation can be similarly applicable where the pad 101 is a power supply pad as in the second mode for implementation.

Figure 9:
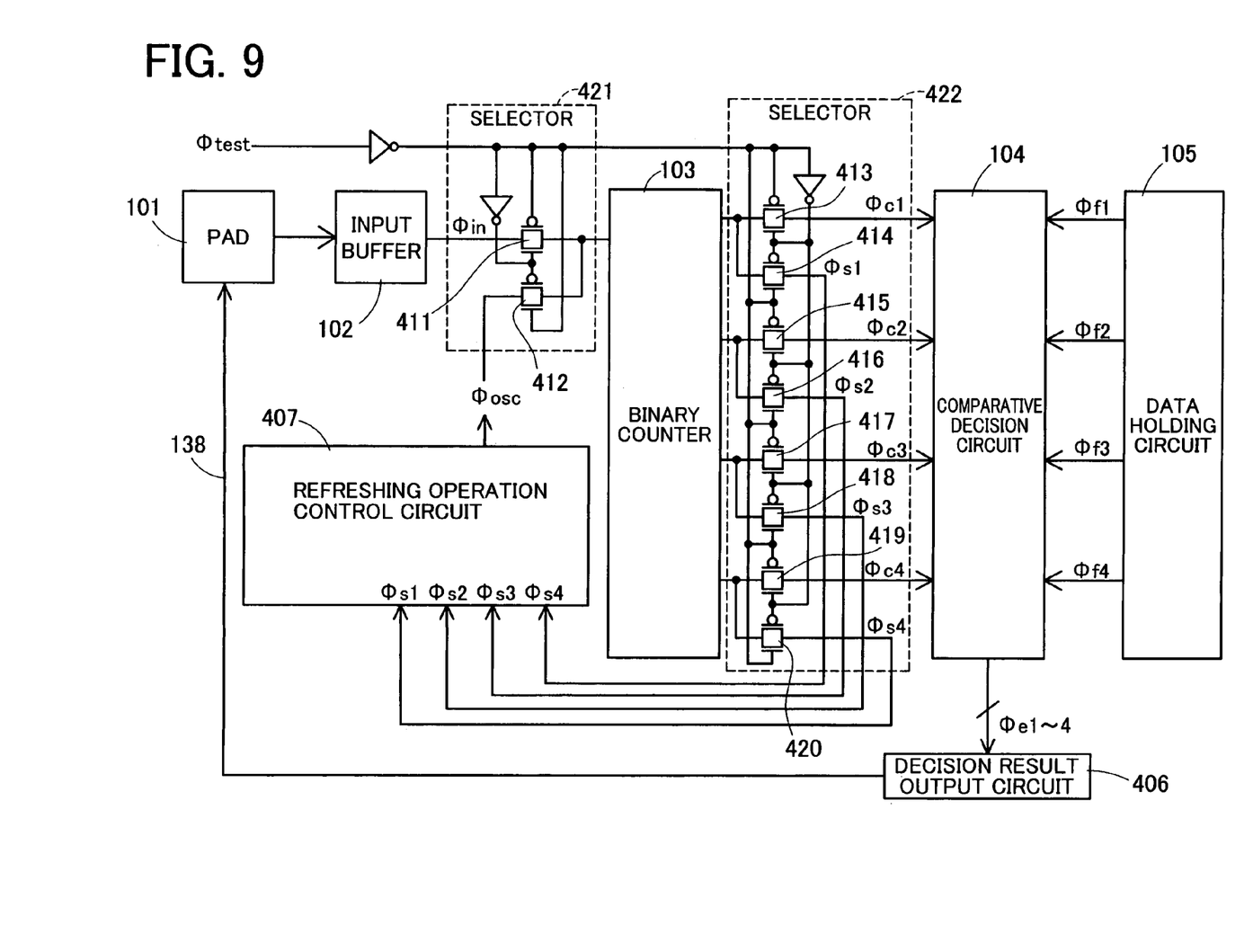
FIG. 9 is a block diagram showing the configuration of a semiconductor integrated circuit device in a fifth mode for implementation.

A fifth mode for implementation will be described with reference to the block diagram of FIG. 9. In FIG. 9, the circuit configurations and operations of a pad 101, an input buffer 102, a binary counter 103, a comparative decision circuit 104 and a data holding circuit 105 are the same as in the first through fourth modes for implementation. There are further provided a refreshing operation control circuit 407 and selectors 421 and 422. An information mode switching signal Φtest is inputted to the selectors 421 and 422 provided in the input/output part of the binary counter 103. The selectors are provided with change-over switches 411 through 420. As a decision result output circuit 406, for instance the decision result output circuit used in, for instance, the first through fourth modes for implementation can be used.

A case in which the information reading mode switching signal Φtest is at a low level will be described. Then, the whole circuit is in the normal operation mode, and the binary counter 103 is used for operating the refreshing operation control circuit 407. Thus, when the signal Φtest is at a low level, as the change-over switch 412 is made conductive and the change-over switch 411 non-conductive, an output signal Φosc of the refreshing operation control circuit 407 is selected as the signal to be inputted to the binary counter 103. At the same time, as the change-over switches 414, 416, 418 and 420 are made conductive and the change-over switches 413, 415, 417 and 419 non-conductive, self-refreshing circuit input signals Φs1 through Φs4 are selected as the count signals to be outputted from the binary counter, and inputted to the refreshing operation control circuit 407.

Conversely, when the information reading mode switching signal Φtest is at a high level, the mode enters into the information reading mode, and the binary counter 103 is used for comparison with data held by the data holding circuit 105. Thus, as the change-over switch 412 is made non-conductive and the change-over switch 411 conductive, an input signal Φin inputted from the input buffer 102 is selected as the signal to be inputted to the binary counter 103. Further, as the change-over switches 414, 416, 418 and 420 are made non-conductive and the change-over switches 413, 415, 417 and 419 conductive, signals Φc1 through Φc4 are selected as the count signals to be outputted from the binary counter 103 and inputted to the comparative decision circuit 104.

As described above, according to the invention in its fifth mode for implementation, the binary counter circuit 103 is enabled to be shared between the refreshing operation control circuit 407 and the comparative decision circuit 104 by the installation of the selectors 421 and 422. Thus, in the normal operation mode of the semiconductor integrated circuit device, the input and the output of the binary counter circuit 103 are connected to the refreshing operation control circuit 407. On the other hand, in the information reading mode, the input of the binary counter circuit 103 is connected to the input buffer 102 and the output of the binary counter circuit 103, to the comparative decision circuit 104.

In this way, the need for a dedicated binary counter circuit for use in reading chip-specific information is eliminated, thereby making it possible to restrain the increase in chip area. Since the binary counter 103 is provided with as many flip-flop circuits as the number of bits of the data held by the data holding unit, the greater the number of bits of internal data, the more serious the problem of increase in chip area. However, by applying the invention in its fifth mode for implementation, as the binary counter 103 can be shared between the refreshing operation control circuit 407 and the comparative decision circuit 104, it is possible to restrain the increase in chip area even when the number of bits of chip-specific information.

Further, the circuit to be shared between the binary counter 103 and the comparative decision circuit 104 is not limited to the refreshing operation control circuit. In a semiconductor memory device, such circuits include a burst operation control circuit.

And in the fifth mode for implementation, the same pad 101 is used by the clock signal input and the decision result output, different pads can obviously be used. Further for the signal to be outputted from the decision result output circuit 406, a system in which a current flows to the pad 101 when the input clock signal and chip-specific information are identical as described with reference to the first and second modes for implementation can be used, or a system in which chip-specific information latched by the latching unit may be outputted to the pad as pulse signals during the signal output period as described with reference to the third and fourth modes for implementation.

To add, the invention is not limited to the above-described modes for implementation, but obviously can be improved or modified in various ways without deviating from the spirit and scope of the invention. Obviously the way of using the input/output pad for chip-specific information, the way of outputting chip-specific information and the way of sharing the binary counter circuit can obviously be combined in various appropriate ways.

As is evident from the foregoing description, the present invention permits reading of information specific to chips within the mounted chips in a packaged state while restraining the increase in the total number of terminals of the package. It further enables the area of circuits required for reading chip-specific information to be made smaller than that according to the prior art and thereby to restrain the increase in chip area.

What is claimed is:

1. A The semiconductor integrated circuit device provided with a data holding unit for storing chip-specific information and having an information reading mode for reading the chip-specific information besides a normal operation mode, characterized in that the semiconductor integrated circuit device comprises:
a counter unit for counting pulse signals inputted from an external terminal in the information reading mode;
a comparative decision unit for comparing the chip-specific information stored in the data holding unit and the output of the counter unit and deciding whether or not the information and the output are identical with each other; and
a decision result output unit that outputs any result of identity decision by the comparative decision unit from the external terminal, and is provided with a switching unit for connecting the external terminal to a prescribed potential,
wherein the decision result output unit causes a notification current to flow to the external terminal in response to a result of identity decision by the comparative decision unit.

2. The semiconductor integrated circuit device according to claim 1, characterized in that the prescribed potential is a different potential from the potential of the pulse signals inputted to the external terminal.

3. The semiconductor integrated circuit device according to claim 1, characterized in that the decision result output unit is provided with a result latching unit for latching the identity decision result from the comparative decision unit.

4. The semiconductor integrated circuit device according to claim 1, characterized in that the external terminal is commonly used with a signal terminal to and from which signals are inputted and outputted in the normal operation mode.

5. The semiconductor integrated circuit device according to claim 1, characterized in that the external terminal is a first power supply terminal which supplies power, regarding the information reading mode, to circuit parts not required for reading the chip-specific information.

6. The semiconductor integrated circuit device according to claim 5, characterized in that the first power supply terminal is a terminal different from a second power supply terminal which supplies power to the data holding unit, the counter unit and the comparative decision unit in the information reading mode.

7. A semiconductor integrated circuit device provided with a data holding unit for storing chip-specific information and having an information reading mode for reading the chip-specific information besides a normal operation mode, characterized in that the semiconductor integrated circuit device comprises:

a counter unit for counting pulse signals inputted from an external terminal in the information reading mode;

a comparative decision unit for comparing the chip-specific information stored in the data holding unit and the output of the counter unit and deciding whether or not the information and the output are identical with each other;

a decision result output unit that outputs any result of identity decision by the comparative decision unit from the external terminal, and an input/output switching unit for changing over, in response to the end of counting of a prescribed count by the counter unit, the external terminal from the input terminal for pulse signals to the output terminal of the chip-specific information.

8. The semiconductor integrated circuit device according to claim 7, characterized by comprising an information latching unit for latching the chip-specific information having undergone identity decision by the comparative decision unit, and characterized in that the chip-specific information latched by the information latching unit is outputted in response to a change-over signal from the input/output switching unit.

9. The semiconductor integrated circuit device according to claim 8, characterized by comprising:

an internal oscillator which is activated in response to the change-over signal; a counter unit for counting clock signals from the internal oscillator; and an output control unit for comparing the chip-specific information stored in the information latching unit and the output of the counter unit and deciding whether or not the information and the output are identical, and characterized in that the clock signals are outputted until the output control unit gives decision on identity.

10. The semiconductor integrated circuit device according to claim 7, characterized by comprising:

an information latching unit for latching the chip-specific information having undergone identity decision by the comparative decision unit; and an output control unit for successively selecting bit positions in the information latching unit in response to a change-over signal from the input/output switching unit.

11. The semiconductor integrated circuit device according to claim 10, characterized in that the output control unit is provided with a start flag unit for generating a start flag before selecting the bit positions in the information latching unit.

12. The semiconductor integrated circuit device according to claim 10, characterized in that the output control unit is provided with an end flag unit for generating an end flag after ending the selection of the bit positions in the information latching unit.

13. The semiconductor integrated circuit device according to claim 10, characterized in that the output control unit successively makes selections from the least significant bit position or the most significant bit position onward.

14. The semiconductor integrated circuit device according to claim 7, characterized in that the external terminal is commonly used with a signal terminal to and from which signals are inputted and outputted in the normal operation mode.

15. The semiconductor integrated circuit device according to claim 7, characterized in that the external terminal is a first power supply terminal which supplies power, regarding the information reading mode, to circuit parts not required for reading the chip-specific information.

16. The semiconductor integrated circuit device according to claim 15, characterized in that the first power supply terminal is a terminal different from a second power supply terminal which supplies power to the data holding unit, the counter unit and the comparative decision unit in the information reading mode.

17. A semiconductor integrated circuit device having a data holding unit for storing chip-specific information and an information reading mode for reading the chip-specific information besides a normal operation mode, characterized in that the semiconductor integrated circuit device comprises:

a counter unit for counting inputted pulse signals;

a comparative decision unit for comparing the chip-specific information stored in the data holding unit and the output of the counter unit and deciding whether or not the information and the output are identical with each other;

at least one functional circuit which requires at least one of the input from the counter unit and the output to the counter unit; and a selector unit, which connects the counter unit to the functional circuit in the normal operation mode and connects the input of the counter unit to an external terminal and the output of the counter unit to the comparative decision unit in the information reading mode.

18. The semiconductor integrated circuit device according to claim 17, characterized in that the change-over operation by the selector unit is accomplished by the inputting of a mode signal for controlling the change-over between the normal operation mode and the information reading mode.

19. The semiconductor integrated circuit device according to claim 17, characterized in that the functional circuit is a circuit for controlling refreshing operations or a circuit for controlling burst operations.

20. A control method for a semiconductor integrated circuit device having an information reading mode for reading chip-specific information stored in advance besides a normal operation mode, characterized by comprising:

a step of counting pulse signals inputted from an external terminal in the information reading mode;

a step of comparing the chip-specific information and the result of counting by the step of counting pulse signals and deciding whether or not the information and the result are identical; and a step of outputting the chip-specific information from the external terminal according to the result of identity decision by the step of deciding whether or not the information and the result are identical, wherein the step of outputting the chip-specific information causes a notification current to flow to the external terminal.

21. A control method for a semiconductor integrated circuit device having an information reading mode for reading chip-specific information stored in advance besides a normal operation mode, characterized by comprising:

a step of counting pulse signals inputted from an external terminal in the information reading mode;

a step of comparing the chip-specific information and the result of counting by the step of counting pulse signals and deciding whether or not the information and the result are identical;

a step of outputting the chip-specific information from the external terminal according to the result of identity decision by the step of deciding whether or not the information and the result are identical;

a step of changing over the external terminal from the input terminal for pulse signals to the output terminal for the chip-specific information in response to the end of counting a prescribed count by the step of counting pulse signals; and a step of outputting the chip-specific information from the external terminal in response to the step of changing over.

* * * * *